United States Patent [19]

Nakagawa et al.

[11] Patent Number: 5,712,199
[45] Date of Patent: Jan. 27, 1998

[54] METHOD FOR MAKING SEMICONDUCTOR BODY AND PHOTOVOLTAIC DEVICE

[75] Inventors: Katsumi Nakagawa, Nagahama; Takao Yonehara, Atsugi, both of Japan

[73] Assignee: Canon Kabushiki Kaisha, Tokyo, Japan

[21] Appl. No.: 466,761

[22] Filed: Jun. 6, 1995

Related U.S. Application Data

[63] Continuation of Ser. No. 777,637, Oct. 16, 1991, abandoned.

[30] Foreign Application Priority Data

Oct. 16, 1990 [JP] Japan .................................. 278696

[51] Int. Cl.$^6$ .................................................. H01L 21/208
[52] U.S. Cl. ........................ 438/62; 438/490; 438/563
[58] Field of Search .............................. 437/2, 86, 91, 437/92, 111, 114, 119, 89, 126, 971, 164; 148/DIG. 26, DIG. 152; 136/252, 261, 262; 117/73

[56] References Cited

U.S. PATENT DOCUMENTS

| | | |
|---|---|---|
| 3,825,449 | 7/1974 | Marinelli et al. . |
| 3,890,194 | 6/1975 | Ettenberg . |
| 4,113,548 | 9/1978 | Sigmund . |
| 4,298,410 | 11/1981 | Nakajima et al. . |
| 4,667,058 | 5/1987 | Catalano et al. . |
| 4,696,758 | 9/1987 | Oushinsky et al. . |
| 4,778,478 | 10/1988 | Barnett ........................ 437/5 |
| 4,851,302 | 7/1989 | Nakagawa et al. ......... 428/658 |
| 4,959,106 | 9/1990 | Nakagawa et al. ......... 136/258 |
| 5,007,034 | 4/1991 | Satoh et al. ................ 437/52 |
| 5,028,488 | 7/1991 | Nakagawa et al. ......... 428/457 |

FOREIGN PATENT DOCUMENTS

| | | |
|---|---|---|
| 4934269 | 9/1974 | Japan . |
| 5796519 | 6/1982 | Japan . |
| 1236690A | 10/1985 | Japan . |
| 64-3096 | 1/1989 | Japan . |
| 157641 | 3/1989 | Japan . |
| 2307889 | 5/1989 | Japan . |
| 1316953 | 12/1989 | Japan . |
| 251223 | 2/1990 | Japan . |

OTHER PUBLICATIONS

J. D. Heaps et al., "Dip–Coated Sheet Silicon Solar Cells," Honeywell Corporate Research Center, pp. 147–150, Jan. 1976.

T.F. Ciszek, "Edge Defined Film–Feed Growth (EFG) of Silicon Ribbons", Mat. Res. Bull., vol. 7, No. 8 (Aug. 1972) p. 731.

B. Kudo, "Improvements in the Horizontal Ribbon Growth Technique for Single Crystal Silicon", J. of Crystal Growth, vol. 50, (Sep. 1980) p. 247.

Freyhardt, H. C., ed., *Crystals: Growth, Properties and Application*, 3 Springer–Verlag, Berlin, ©1980.

Runcan, W.R., *Silicon Semiconductor Technology* McGraw–Hill, NY, ©1965, pp. 63–65.

*Primary Examiner*—George R. Fourson
*Attorney, Agent, or Firm*—Fitzpatrick, Cella, Harper & Scinto

[57] ABSTRACT

A method of making a semiconductor body includes the steps of preparing a sheet-like substrate having an insulating film and holes which pass through the insulating film, the holes being disposed at a uniform density, preparing a solution in which a semiconductor material is dissolved, and conveying the sheet-like substrate along a surface of the solution so as to grow a single crystal nucleus from each of the holes and thereby form a set of single crystal semiconductors on the sheet-like substrate. A solar cell can be manufactured by forming a semiconductor active area on the sheet-like support member made of a conductive material by a process containing the above-described semiconductor body forming method, and then by forming an electrode which makes a pair with the sheet-like support member.

13 Claims, 13 Drawing Sheets

FIG. I (A)
PRIOR ART
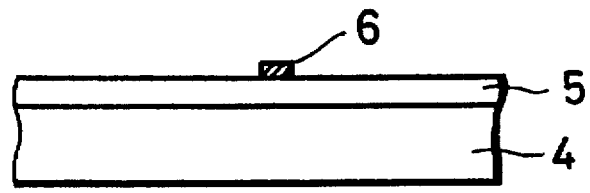
FIG. I (B)
PRIOR ART
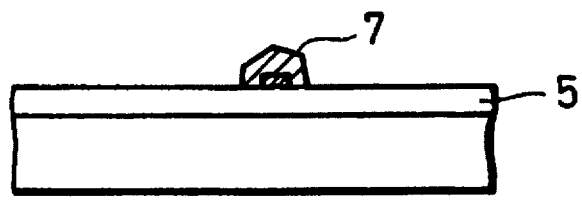
FIG. I (C)
PRIOR ART
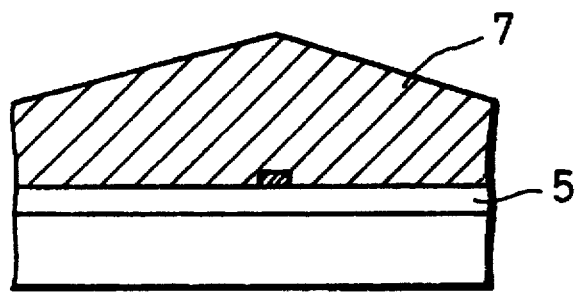

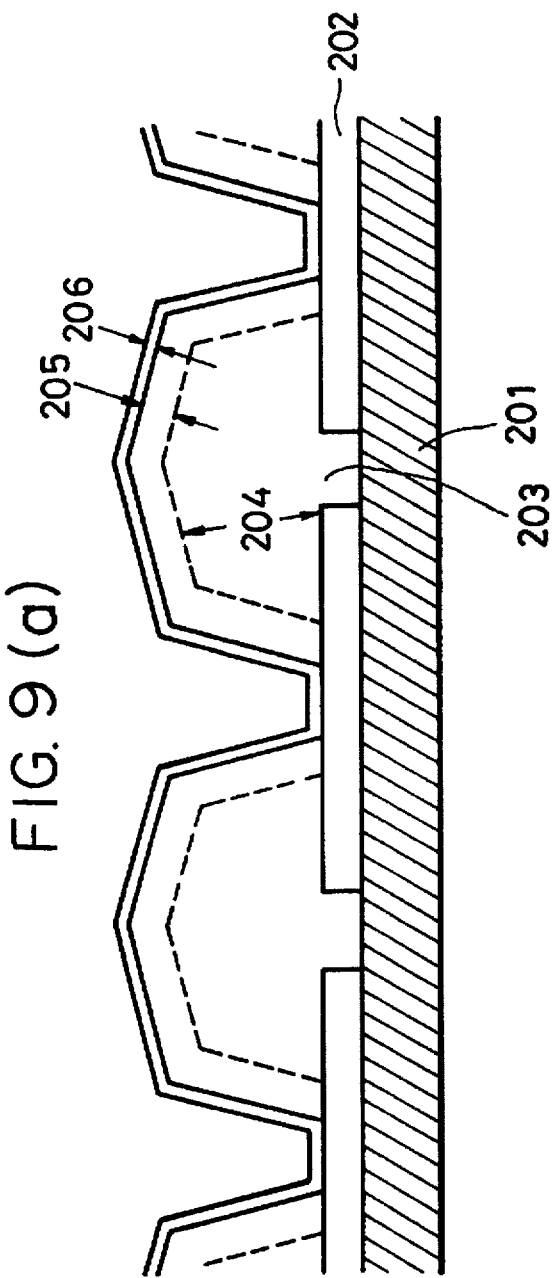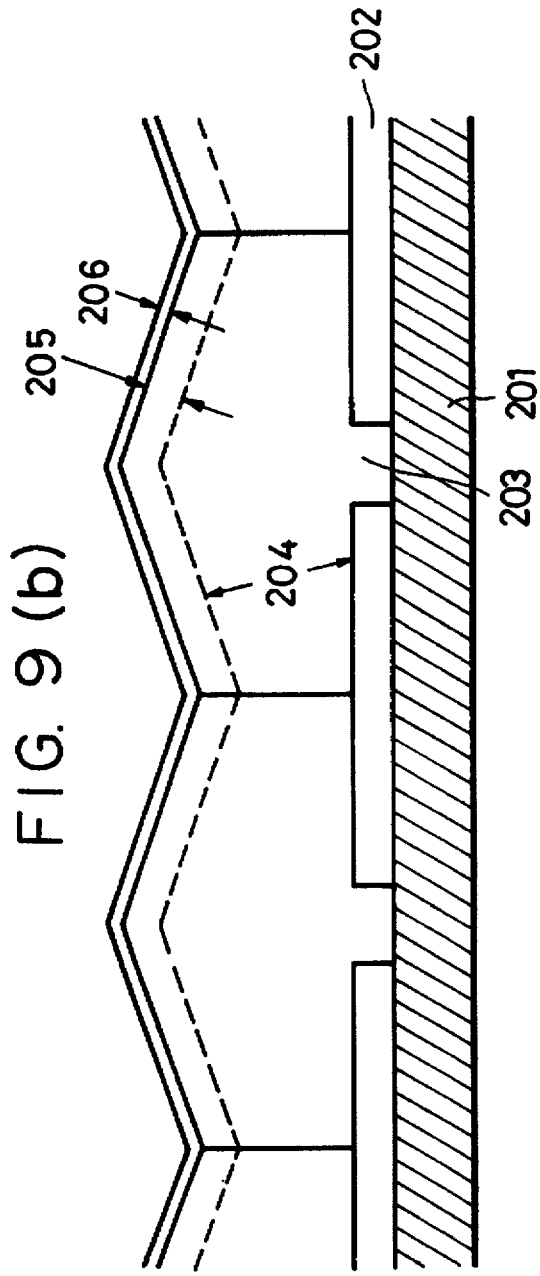

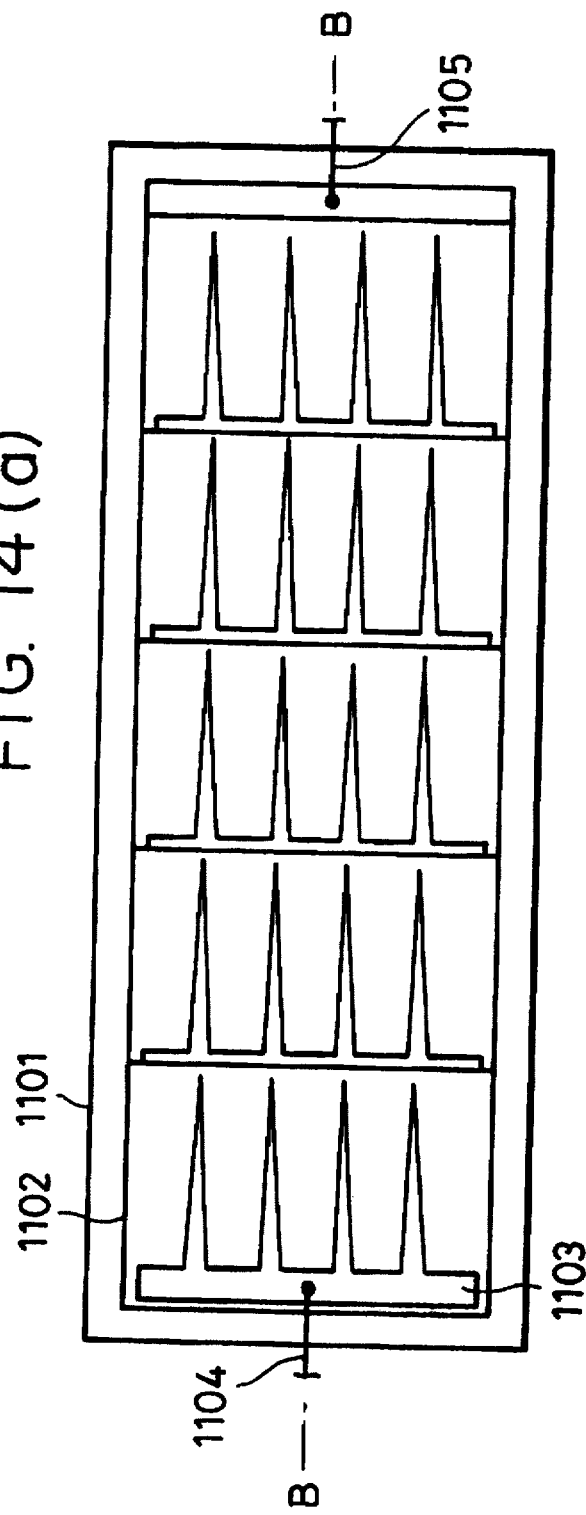
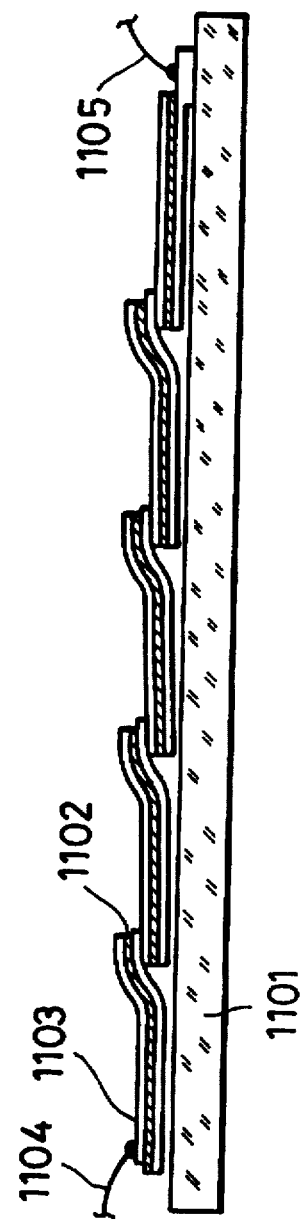
FIG. 14(a)
FIG. 14(b)

5,712,199

METHOD FOR MAKING SEMICONDUCTOR BODY AND PHOTOVOLTAIC DEVICE

This application is a continuation of application Ser. No. 07/777,637 filed Oct. 16, 1991, now abandoned.

BACKGROUND OF THE INVENTION

1. Field of the Invention

The present invention relates to a method of forming semiconductor layers as well as a method of manufacturing photovoltaic devices. More particularly, the present invention pertains to a method of forming semiconductor layers successively under advantageous conditions, and a method of manufacturing highly efficient and reliable photovoltaic devices at a low cost by using such a semiconductor layer forming method.

2. Description of the Related Art

Power generation systems employing solar cells have advantages in that maintenance is easy and the operation requires less cost, in that they do not generate exhaust gas or the like, and in that the system can be manufactured in a wide range of sizes. Manufacture of power generation systems employing solar cells on an industrial basis has been anticipated especially as independent power sources installed at remote sites. However, production costs of conventional solar cells using a single crystal semiconductor substrate made of gallium arsenide or silicon are high and hence manufacturing such solar cells requires expensive initial investment. For this reason, solar cells using a single crystal semiconductor substrate have not been used extensively.

Unlike the manufacture of integrated circuits, production of solar cells does not always require the use of a single crystal substrate. Hence, various methods of manufacturing polycrystal substrate for use in a solar cell have been developed in an effort of reducing the production cost of the substrate. In one method, called the casting method, an ingot of a polycrystal semiconductor is obtained by directly solidifying molten semiconductor within a crucible. Polycrystal semiconductor substrates (for example, polycrystal silicon substrates) manufactured from such an ingot assure the maximum conversion efficiency of about 15%. This value is by no means inferior to the conversion efficiency of 18% of the single crystal substrate (light non-collecting type), and guarantees the use of the polycrystal substrate as the semiconductor material for solar cells.

However, since substrates are produced in the casting method by slicing the ingot, each of the substrates has a thickness ranging between 300 μm and 500 μm, compared with 20 to 100 μm for a silicon substrate and 1 to 2 μm for a substrate made of gallium arsenide. This thickness is far larger than that required for the substrate to absorb the major spectral components of sunlight. Furthermore, loss by slicing of the marginal areas of the ingot cannot be eliminated, and polishing of the surface of the substrate is required. Consequently, production cost of the polycrystal substrates is almost the same as that of the single crystal substrates, and reduction in the cost is impossible.

Japanese Patent laid-Open No. 3096/1989 discloses a method of forming a semiconductor layer by forming crystal nuclei on an amorphous substrate at controlled positions and then by growing such crystal nuclei to form a set of single crystals on the substrate. Such a semiconductor layer exhibits characteristics substantially equivalent to those of a single crystal substrate. The aforementioned Japanese Patent also proposes a method of manufacturing a solar cell exhibiting excellent characteristics using a semiconductor layer formed by the above-described method.

FIGS. 1(A), 1(B) and 1(C) illustrate the principle of the above semiconductor layer forming method. As shown in FIG. 1(A), a thin film 5 made of an amorphous material having a low nucleus forming density, such as silicon oxide, is formed on a substrate 4. Thereafter, a nucleus forming surface 6 of silicon nitride is formed by forming a thin film made of an amorphous material having a high nucleus forming density, such as silicon nitride, on part of the thin film 5 and then by patterning the thin film of silicon nitride by the photolithographic process or the like. Subsequently, this semiconductor layer is immersed into molten solution obtained by dissolving Si in a solvent, such as Ga, In, Sb, Bi or Sn by heating. Crystal nuclei are generated only on the nucleus forming surface by gradually decreasing the temperature of the molten silicon and thereby making the molten silicon supersaturated. The nucleus forming surface 6 must be finely patterned, e.g., each surface must have the maximum diameter of 10 μm or less, so that only a single crystal nucleus which grows into a single crystal can be formed thereon. The crystal nuclei do not generate on the silicon oxide film. As shown in FIGS. 1(B) and 1(C), a single crystal grain 7 on each of the nucleus forming surfaces 6 gradually grows while maintaining the single crystal structure. When a large number of nucleus forming surfaces 6 are formed on the substrate, the surface of the substrate can be covered by the large number of single crystals 7.

When the large number of nucleus forming surfaces 6 are distributed uniformly, the grain size of the single crystal nuclei 7 can be made almost the same. In consequence, provision of a substantially single crystal film can be easily controlled.

Although the solar cells manufactured, using the above substantially single crystal film, exhibit excellent characteristics, this conventional technique is based on the batch process, and is hence not suited to mass produce solar cells at low cost.

To manufacture semiconductor sheets for use in solar cells at low cost, attempts have been made to produce a polycrystal semiconductor sheet directly from molten semiconductor (so-called sheet technologies). Typical sheet technologies for manufacturing a silicon sheet will be described below in detail.

FIG. 2 illustrates the EFG method described in Mat. Res., Bull. 7 (1972) 731 by T. F. Ciszek.

In the EFG method, a molten silicon 1201 contained in a quartz crucible 1202 is heated by heating means 1203. The molten silicon 1201 is pulled up through a narrow gap between graphite dice 1204. The molten silicon 1201 is solidified at a solid/liquid interface 1205 to form a silicon ribbon crystal 1206.

FIG. 3 illustrates the horizontal pulling method described in J. Crystal Growth 50 (1980) 247 by B. Kudo.

In this method, a molten silicon 1301 contained in a quartz crucible 1302 is heated by heating means 1303. The surface of the molten silicon is cooled by cooling means 1304 and is thereby gradually solidified. The solidified layer is pulled in a horizontal direction to obtain a silicon ribbon crystal 1305.

FIG. 4 illustrates the SOC method described in Proc. 12th IEEE Photovoltaic Specialists Conf. (1976) by J. D. Heaps, R. B. Meciolek et al.

In this method, a ceramic support member 1402 immersed in a molten silicon 1401 is slowly pulled up, by which a polycrystal silicon layer 1403 is formed on the surface of the ceramic support member 1402.

However, the aforementioned conventional sheet technologies have the following drawbacks.

In the EFG method which has been researched for a long time, since the solid/liquid interface is narrow, the growth rate of the semiconductor substrate may be low. Furthermore, when the gap between the graphite dice is narrowed, the range of adequate mechanical and thermal conditions is narrowed, making the growth unstable. This makes manufacture of thin semiconductor substrate difficult.

In the horizontal pulling method, although a high growth rate is provided due to a wide solid/liquid interface, it is difficult to pull a substrate under conditions in which the molten silicon does not overflow from the edge portion of the crucible from which the solidified layer is pulled out.

In both the EFG method and the horizontal pulling method, it is thus impossible to provide a thin semiconductor substrate. Therefore, the semiconductor substrate obtained in both methods is less flexible and must therefore be cut into a fixed size. The semiconductor substrate having a large size has a low mechanical strength. Such a semiconductor substrate cannot be handled easily, and is hence not suited for continuous production.

In the SOC method, since the semiconductor layer grows on the support member, the thickness of the semiconductor layer can be easily adjusted. Furthermore, the semiconductor layer has a mechanical strength based on the support member, and can thus be handled easily. However, when a semiconductor having a high melting point, such as silicon (whose melting point is 1410° C.) or gallium arsenide (having a melting point of 1240° C.), is used, the support member immersed into the liquid must be highly heat resistant. For this reason, a thin metal sheet having a sufficient flexibility at the practical level cannot be used.

Furthermore, the semiconductor layer obtained in these conventional methods is a polycrystal semiconductor layer, and the size of the crystal grain or position thereof cannot be directly controlled. Therefore, control of distribution of temperature of the molten semiconductor or of pulling rate, required to obtain excellent reproducibility, is very difficult.

Such technical problems are also encountered in the technique disclosed in U.S. Pat. No. 4,778,478 titled "Method of making thin film photovoltaic solar cell" and given to Barnett.

As stated above, although the conventional sheet technologies have advantages in that they do not require slicing and polishing processes necessary for single crystal substrates or polycrystal substrates obtained by the casting method, they have some of the following drawbacks.
(1) The growth rate is not sufficiently high.
(2) The thickness of the substrate sheet cannot be reduced to an optically required extent.
(3) Since sufficient flexibility or mechanical strength cannot be obtained easily, application of continuous production is difficult.
(4) Control of the size of the crystal grain is difficult.

SUMMARY OF THE INVENTION

An object of the present invention is to provide a method of forming a semiconductor body successively under an advantageous condition and a method of manufacturing a solar cell exhibiting excellent characteristics at a low cost which ensures practical use thereof as a power supply cell using the above method.

To achieve the above object, the present invention provides a method of a semiconductor body which includes the steps of preparing a sheet-like substrate having an insulating film and holes which pass through the insulating film, the holes being disposed at a uniform density, preparing a solution in which a semiconductor material is dissolved, and conveying the sheet-like substrate along a surface of the solution so as to grow a single crystal nucleus from each of the holes and thereby form a set of single crystal semiconductors on the sheet-like substrate.

BRIEF DESCRIPTION OF THE DRAWINGS

FIGS. 1(a)–1(c) are a schematic view illustrating a method of forming a single crystal on an amorphous substrate;

FIGS. 9(a) and 9(b) are a schematic cross-sectional view of a solar cell manufactured on a stainless sheet sheet by the method of the present invention;

FIGS. 14(a) and 14(b) are a schematic view illustrating a solar cell array in which photovoltaic elements are series connected.

DETAILED DESCRIPTION OF THE PREFERRED EMBODIMENTS

Figure 2:
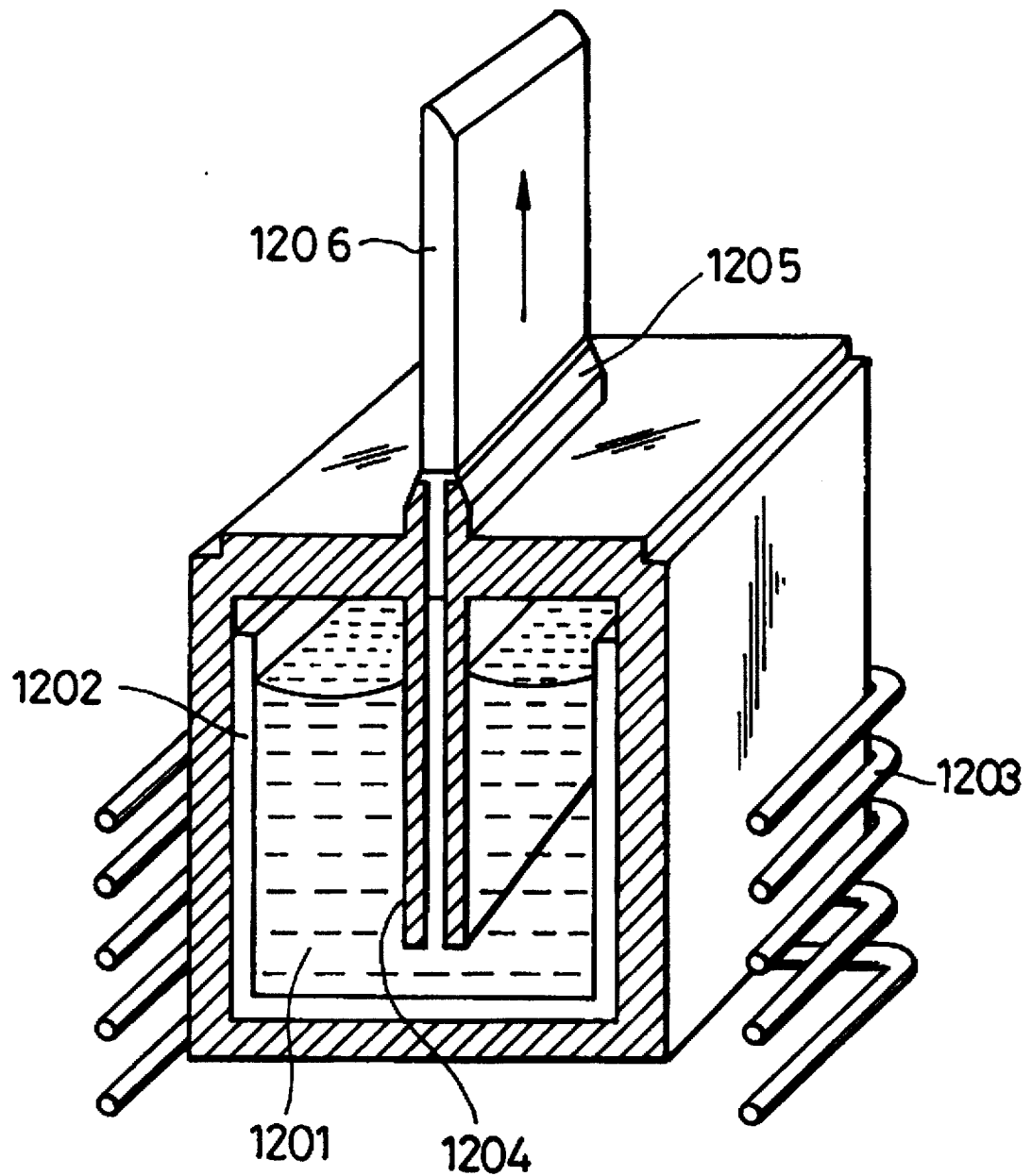
FIG. 2 is a schematic view illustrating a method of making a polycrystal silicon substrate by the EFG process.
Figure 3:
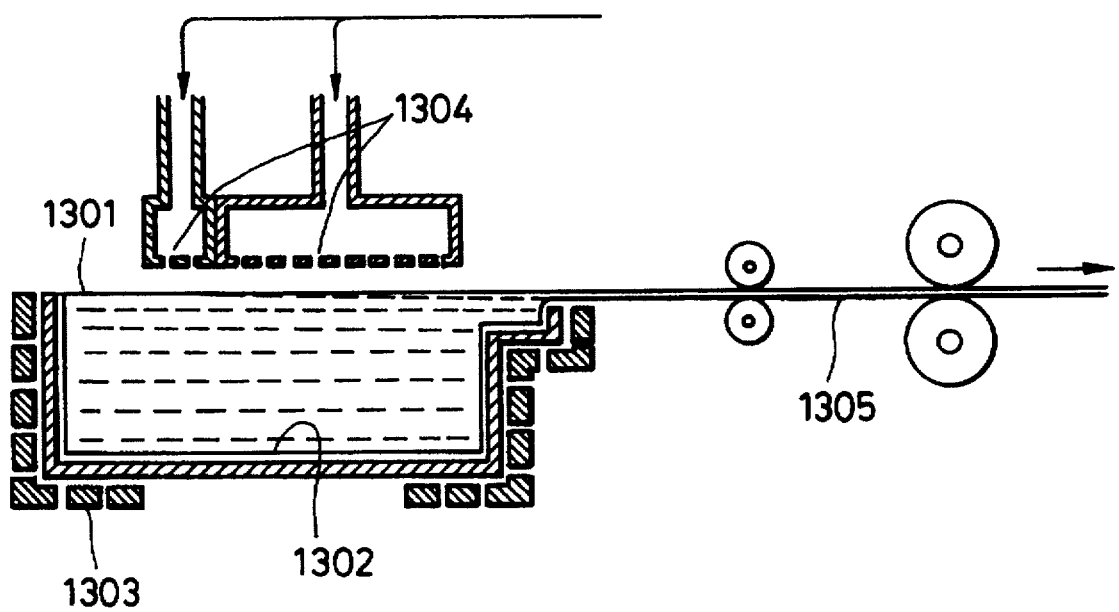
FIG. 3 is a schematic view illustrating a method of making a polycrystal silicon substrate by the horizontal pulling process.
Figure 4:
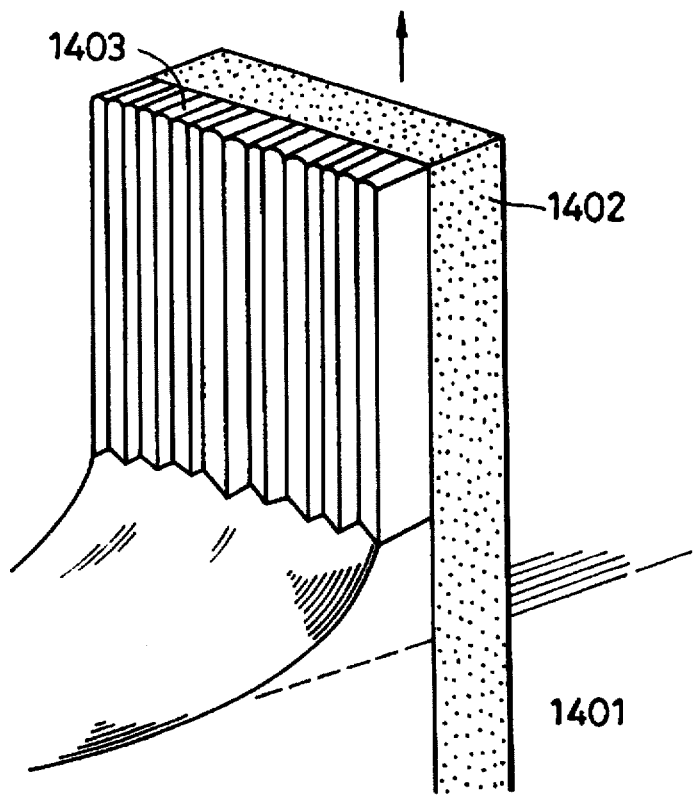
FIG. 4 is a schematic view illustrating a method of making a polycrystal silicon substrate by the SOC process.

The present inventors took note of the conventional sheet technologies and came to the conclusion that the objective technology should satisfy the following fundamental conditions.

(1) In order to achieve a high growth rate, the objective technology is based on the horizontal pulling method which ensures a wide solid-liquid interface.
(2) In order to facilitate control of the film thickness and handling in the manufacturing process, a semiconductor layer is formed on a support member.
(3) To increase the range of selection of the usable support members, crystal can be grown at a low temperature.
(4) In order to improve the reproducibility of the characteristics of the semiconductor layer, the size of the crystal grain or position thereof can be controlled.

The present inventors made intensive studies on the basis of the above-described conclusion, and completed this invention.

In the method of forming a semiconductor body according to the present invention, a sheet-like support member is fed along the surface of an almost saturated molten semiconductor obtained by dissolving a semiconductor material in a solvent. The temperature of the molten semiconductor is maintained to the melting point of the semiconductor or below. The sheet-like support member has a layer made of silicon oxide having a low nucleus forming density, and a large number of fine nucleus forming surfaces formed at a uniform density on the silicon oxide layer. Each of the nucleus forming surfaces is so fine that a single crystal nucleus which grows into a single crystal can be generated thereon. When the surface of the sheet-like support member makes contact with the surface of the molten semiconductor, the sheet-like member is cooled to the temperature of the molten semiconductor or below, by which a single crystal nucleus is generated on each of the nucleus forming surfaces on the surface of the support member which is in contact with the molten semiconductor and a crystal film whose crystal grain has a controlled size is thereby deposited on the surface of the sheet-like support member. The method of manufacturing a solar cell includes the stepsof forming semiconductor active areas on the sheet-like support member by performing the above-described method using a conductive material as the sheet-like support member, and forming on each of the semiconductor active areas an electrode which makes a pair with the sheet-like support member.

Method of Manufacturing a Sheet-Like Support Member Used in the Present Invention A metal sheet made of stainless steel, aluminum, copper or nickel or an alloy sheet made of these metals can be used as the sheet-like support member for the present invention. A silicon oxide film may be directly formed on the metal or alloy sheet by the thermal CVD process which employs $SiH_4$ and $O_2$ (precipitation temperature: 300° to 700° C.), the thermal CVD method which employs $SiH_4$ and $CO_2$ (precipitation temperature: 700° C. or above), or the reactive sputtering method. In the thermal CVD method which employs $SiH_4$ or the sputtering method, the silicon oxide film may also be formed by oxidizing the silicon film formed by the precipitation of molten Si which will be described later. Thermal oxidation of the silicon film is conducted by exposing the sheet-like support member with the silicon film formed thereon to an atmosphere of oxygen or vapor with a carrier gas, such as nitride or argon, for ten minutes or longer while maintaining the temperature of the sheet-like support member to 800° C. or above. The thickness of the silicon oxide film required to carry out the present invention is 100 Å or more. Defects, such as pinholes, may become the nucleus forming surfaces, thus making distribution of the crystal grains non-uniform. Hence, in order to prevent generation of pinholes, a silicon oxide film having a thickness of at least 500 Å or above, more preferably, of 1000 Å or above, is desired. However, when the silicon oxide film is formed by oxidizing the silicon film, the thickness of the silicon oxide film may be 100 Å or above while the total thickness of the silicon oxide film and non-oxidized silicon film may be at least 500 Å or above, more preferably, 1000 Å or above.

The use of an amorphous silicon nitride film as the fine nuclei forming surfaces provided on the amorphous silicon oxide film has been described in connection with FIG. 1. However, this structure makes conduction between the substrate and the semiconductor layer difficult. Therefore, in this invention, through-holes which pass through at least the silicon oxide film is formed in the silicon oxide film and the metal exposed in each of these holes is thereby made the nucleus forming surface so as to ensure conduction between the substrate and the semiconductor film.

Figure 5:
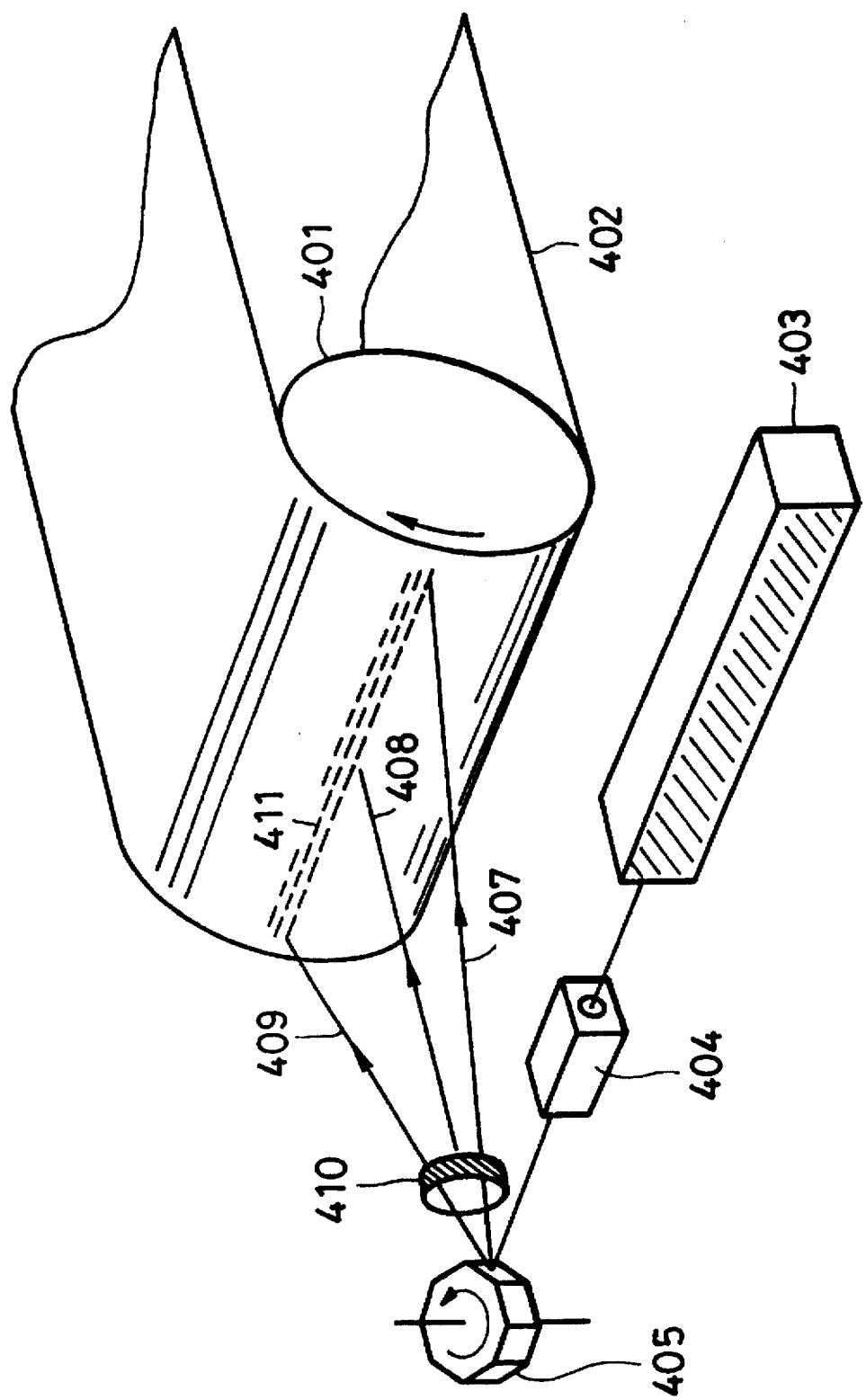
FIG. 5 is a schematic view of a device for forming nucleus forming surfaces on a substrate.

The fine holes can be reliably formed in the silicon oxide film by the photolithographic process. More specifically, after a positive photo resist having an adequate viscosity is uniformly coated on the oxide film, it is prebaked at 100° C. in an atmosphere of nitrogen. Thereafter, ultraviolet radiation is illuminated on the portions of the surface of the coated photo resist, corresponding to the nuclei forming surfaces. The nucleus forming surface pattern may be formed by a mask aligner or by the scanning of a laser beam. FIG. 5 shows an example of a device for carrying out a laser beam scanning. A sheet-like support member 402 is holed by a drum 401. The sheet-like support member 402 has on the surface thereof a silicon oxide film and a prebaked positive resist film. A beam from an argon ion laser 403 passes through a modulator 404 which modulates the beam into a pulsed beam. The pulsed beam is reflected by the surface of a polygonal mirror 405 which is rotating at a high speed, and thereby scans the surface of the sheet-like support member, as indicated by 407, 408 and 409. At that time, the reflected pulsed beam passes through a f-θ lens 410 so that uniform scanning can be achieved. Concurrently with the scanning of the pulsed beam, the sheet-like support member 402 is conveyed in the longitudinal direction thereof, by which dot-like exposed portions 411 are formed on the surface of the sheet-like support member 402. Subsequently, development is conducted using an AZ developer diluted by water, and then washing is performed using water. Thereafter, postbaking is conducted at 180° C., and then silicon oxide is etched using hydrofluoric acid diluted by acetic acid.

The portion of the silicon film which is not completely oxidized is not removed by this etchant. Finally, washing is conducted first with trichloro: then chemistrip, trichloro, and finally acetone to remove the resist, and washing with pure water is then conducted.

Figure 6:
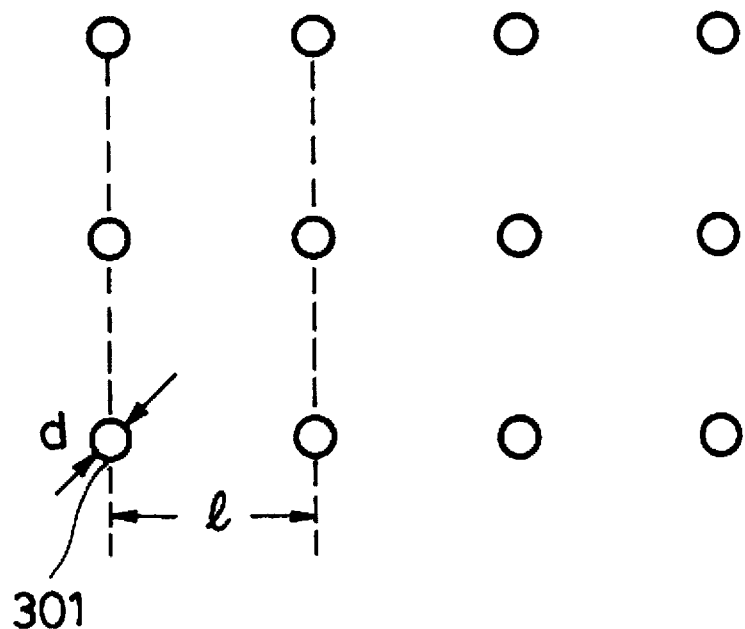
FIGS. 6(a) and 6(b) show patterns of the nucleus forming surfaces formed on the substrate.
Figure 6:
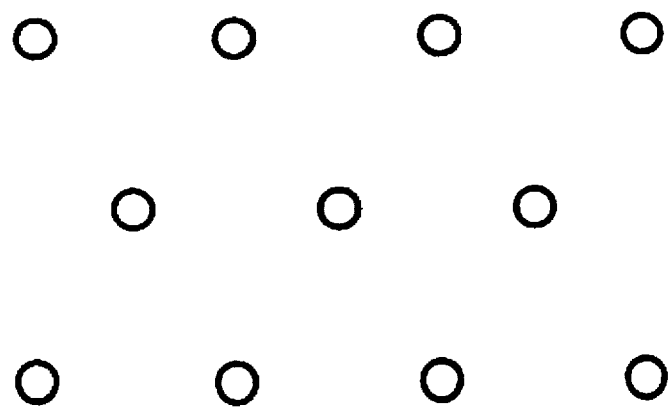

If circular nucleus forming surfaces 301 are formed, as shown in FIG. 6(a), the diameter d of the nucleus forming surface 301 is 20 μm or less, more preferably, 10 μm or less, and most preferably, 5 μm or less. The intervals 1 of the nuclei forming surfaces 301 is between 30 μm and 500 μm, more preferably, between 50 μm and 300 μm, and most preferably, between 80 μm and 200 μm. The nuclei forming surfaces 301 may be distributed in the manner shown in FIG. 6(a) or 6(b).

The sheet-like support member suitable for use in the present invention can thus be manufactured.

Detailed Description of the Film Forming Method

Figure 7:
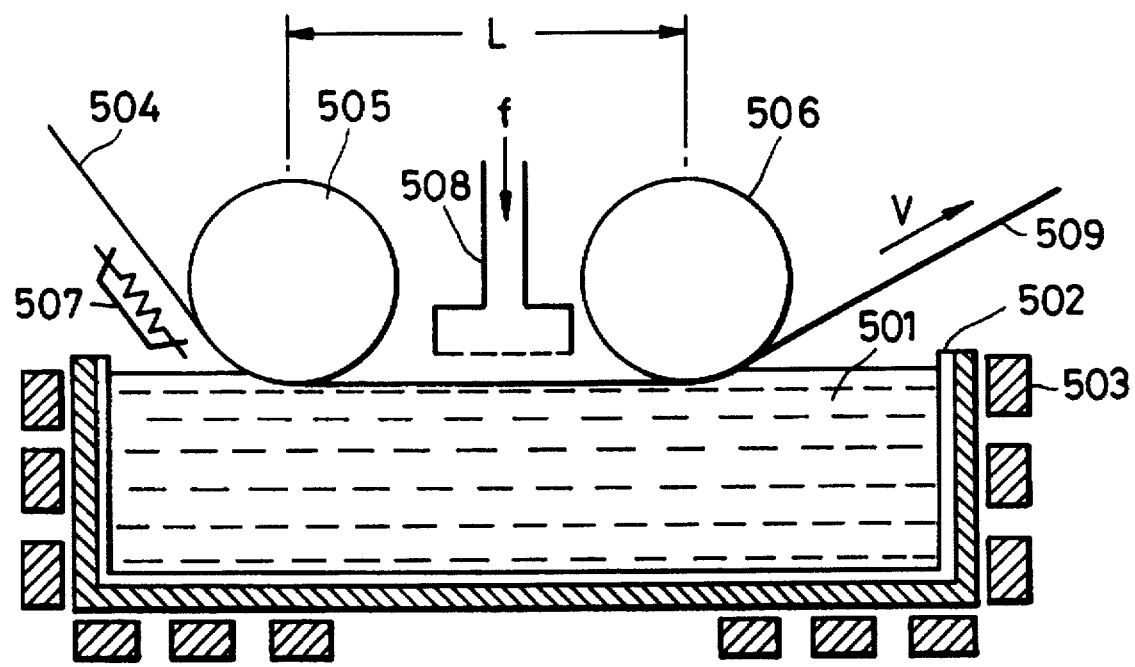
FIG. 7 is a schematic view of a device for forming a semiconductor film on a substrate according to the present invention.

FIG. 7 is a schematic view of the fundamental structure of a device used to carry out the present invention.

In the device shown in FIG. 7, a molten semiconductor 501 contained in a quartz crucible 502 is heated by heating means 503. A flexible sheet-like support member 504 is fed at a speed v through a pair of rollers 505 and 506 separated from each other by an interval L. The undersurface of the portion of the sheet-like support member 504 located between the rollers 505 and 506 is in contact with the surface of the molten semiconductor 501. Before the sheet-like support member 504 is brought into contact with the molten semiconductor 501, it is heated by a preheating heater 507 to a temperature higher than the temperature of the molten semiconductor 501. After contact is initiated, the sheet-like support member 504 is cooled from above by a cooling gas supplied from cooling means 508, by which the temperature of the sheet-like support member 504 is gradually reduced to a temperature lower than the temperature of the molten semiconductor 501 and a semiconductor layer 509 is thereby formed on the surface of the support member 504 while the support member 504 is in contact with the molten semiconductor 501. The thickness of the semiconductor layer 509 can be set to a desired value by adjusting the interval L between the rollers 505 and 506 and the temperature and feed speed v of the support member 504.

Decrease in the interval L produces a thin semiconductor layer 509, and increase in the interval L forms a thick semiconductor 509. Increase of the temperature of the support member 504 produces a thin semiconductor layer 509, and decrease of the temperature forms a thick semiconductor layer 509. Increase in the feed speed v of the support member 504 forms a thin semiconductor layer, and decrease in the feed speed v manufactures a thick semiconductor layer. To form the semiconductor layer 509, the feed speed of the sheet-like support member 504 may be set to 0.

A preferable interval L is between 1.5 cm and 20 m, with more preferable one between 3 cm and 10 m, and the most preferable one between 5 cm and 5 m. When the interval L is 1.5 cm or narrower, rollers having a small diameter must be used. In that case, the sheet-like support member is under a bending stress, and is thus susceptible to film peeling. An interval L which is 20 m or longer makes control of the temperature or the flow of molten semiconductor difficult. This makes uniform growth of the film impossible, and a film having a non-uniform thickness is thus formed.

A preferable feed speed v is between 0.5 cm/min and 5 m/min, with more preferable one between 2 cm/min and 3 m/min and the most preferable feed speed between 5 cm/min to 1.5/min. When the feed speed v is 0.5 cm/min or slower, accurate temperature or molten composition control is required. This makes control complicating. A feed speed v which is 5 m/min or faster may generate a turbulent flow of the molten semiconductor, thus making a film having excellent quality impossible.

A desirable temperature of the cooling gas is about 5° to 50° C. lower than the temperature of the molten semiconductor, with more preferable one about 5° to 30° C. lower than the temperature of the molten semiconductor, and most preferable temperature 10° to 20° C. lower than the temperature of the molten semiconductor.

Thus, a semiconductor film thick enough to absorb the major spectral components of the sunlight but thin enough to maintain flexibility can be easily manufactured.

The molten semiconductor 501 is obtained by dissolving the semiconductor material to be deposited, such as Si, Ge, As, Ga, In or P, into a suitable solvent in a saturated or almost saturated manner. The molten semiconductor 501 has a melting point lower than the melting point of the semiconductor. Hence, when the sheet-like support member 504 is brought into contact with the molten semiconductor 501 having a relatively low temperature and the temperature of the support member 504 is reduced to the temperature of the molten semiconductor 501 or below, the semiconductor material melted in the molten liquid is supersaturated and thus starts growing on the undersurface of the sheet-like support member 504. When Si is used as the semiconductor material, the temperature of the molten semiconductor 501 can be greatly reduced to 300° to 1000° C. by using Ga, In, Sb, B or Sn as the solvent, as compared with the melting point 1410° C. of Si. If GaAs is used as the semiconductor material, it is possible to reduce the temperature of the molten semiconductor to 300° to 900° C. by using Ga, Zn or Sn as the solvent, as compared with the melting point 1240° C. of GaAs. As a result, a metal sheet made of stainless steel (melting point: 1420° to 1470° C.), aluminum (melting point: 660° C.), copper (melting point 1083° C.) or nickel (melting point 1455° C.) or an alloy sheet made of any of these metals can be used.

EXAMPLE 1

Pellets of tin (Sn) were supplied to the quartz crucible 502 of the device shown in FIG. 7 and were heated to melt them. Thereafter, the temperature of the molten tin was increased to 895° C. In that state, the stainless sheet 504 having a width of 50 mm and a thickness of 0.1 mm was fed at a speed of 5 cm/min through the rollers 505 and 506 which were separated by an interval L of 50 cm. The surface of the stainless sheet 504 was heated by the preheating heater 507° to 900° C. The portion of the stainless sheet 504 located between the rollers 505 and 506 was brought into contact with the molten Sn 501. At that time, no cooling gas was supplied to the cooling means 508.

In that state, contact of the stainless sheet 504 with the molten Sn 501 formed nothing on the undersurface of the stainless sheet 504.

Next, silicon (Si) power was added to the molten Sn 501 little by little while the molten Sn was stirred. When Si was saturated in the molten Sn and a gray Si layer thereby started growing on the undersurface of the stainless sheet 504, addition of Si power was suspended and the temperature of the molten Sn was increased to 900° C. Again, contact of the stainless sheet 504 with the molten Sn formed nothing on the surface of the sheet 504.

Subsequently, argon (Ar) was supplied to the cooling means 508 at a rate of 500 sccm as the cooling gas, by which a Si layer started growing again on the surface of the stainless sheet 504. The surface of the obtained Si layer was observed using a scanning type electronic microscope (SEM). It was observed that polygonal crystal gains were formed regularly around the individual nuclei forming surfaces. The crystal grains had an almost same size of about 50 μm. The height of the crystal grains was evaluated as about 20 μm by a surface roughness tester.

The concentration of Sn mixed in the Si layer was evaluated as about $5 \times 10^{16}$ cm$^{-3}$. Since Sn mixed in Si does not change impurity level or recombination level, it does not greatly affect the electric characteristics of Si.

Experiments were conducted in which the stainless sheet 504 was fed at a feed speed v of 5 cm/min, 10 cm/min, 20 cm/min and 40 cm/min while the interval L between the rollers 505 and 506 was set to 2 m. Table 1 shows the results of the experiments.

TABLE 1

| Sheet feed speed (cm/min) | 5 | 10 | 20 | 40 |
|---|---|---|---|---|
| Height of crystal grain (μm) | 40 | 33 | 20 | 15 |
| Grain size (μm) | 100 | 80 | 50 | 35 |
| Impurity ($10^{16}$cm$^{-3}$) | 12 | 8 | 5 | 5 |

When the sheet was fed at a speed of 40 cm/min, two or more crystal gains were generated on some of nuclei forming surfaces, and the crystal orientation deteriorated. From the above-described results, it can be seen that even when the sheet is fed at a high speed, the Si layer exhibiting the same characteristics can be obtained by making the interval L between the rollers longer, and that an excellent semiconductor body can be manufactured by the method of the present invention.

EXAMPLE 2

Pellets of indium (In) were supplied to the quartz crucible 502 of the device shown in FIG. 7, and were heated to melt them. Thereafter, the temperature of the molten indium was increased to 835° C. In that state, the stainless sheet 504 having a width of 50 mm and a thickness of 0.1 mm was fed at a speed of 5 cm/min through the rollers 505 and 506 which were separated by an interval L of 50 cm. The surface of the stainless sheet 504 was heated by the preheating heater 507° to 840° C. The portion of the stainless sheet 504 located between the rollers 505 and 506 was brought into contact with the molten In 501. At that time, no cooling gas was supplied to the cooling means 508.

In that state, contact of the stainless sheet 504 with the molten In 501 formed nothing on the undersurface of the stainless sheet 504.

Next, silicon (Si) power was added to the molten In 501 little by little while the molten In was stirred. When a gray thin Si layer started growing on the undersurface of the stainless sheet 504, addition of Si power was suspended and the temperature of the molten In was increased to 840° C. Again, contact of the stainless sheet 504 with the molten In formed nothing on the surface of the sheet 504.

Subsequently, argon (Ar) was supplied to the cooling means 508 at a rate of 500 sccm as the cooling gas, by which a Si layer started growing again on the surface of the stainless sheet 504.

The surface of the obtained Si layer was observed. It was recognized that polygonal crystal gains were formed regularly around the individual nuclei forming surfaces. The crystal grains had an almost same size of about 60 µm. The height of the crystal grains was about 20 µm.

The concentration of In mixed in the Si layer was evaluated as about $1 \times 10^{16}$ cm$^{-3}$. Since In mixed in Si acts as an acceptor, a p type Si layer is formed.

EXAMPLE 3

Pellets of antimony (Sb) were supplied to the quartz crucible 502 of the device shown in FIG. 7, and were heated to melt them. Thereafter, the temperature of the molten antimony was increased to 715° C. In that state, the stainless sheet 504 having a width of 50 mm and a thickness of 0.1 mm was fed at a speed of 5 cm/min through the rollers 505 and 506 which were separated by an interval L of 50 cm. The surface of the stainless sheet 504 was heated by the preheating heater 507° to 720° C. The portion of the stainless sheet 504 located between the rollers 505 and 506 was brought into contact with the molten Sb 501. At that time, no cooling gas was supplied to the cooling means 508.

In that state, contact of the stainless sheet 504 with the molten Sb 501 formed nothing on the undersurface of the stainless sheet 504.

Next, silicon (Si) power was added to the molten Sb 501 little by little while the molten In was stirred. When a gray thin Si layer started growing on the undersurface of the stainless sheet 504, addition of Si power was suspended and the temperature of the molten Sb was increased to 720° C. Again, contact of the stainless sheet 504 with the molten Sb formed nothing on the surface of the sheet 504.

Subsequently, argon (Ar) means 508 at a rate cooling means 508 at a rate of 500 sccm as the cooling gas, by which a Si layer started growing again on the surface of the stainless sheet 504.

When the surface of the obtained Si layer was observed, polygonal crystal gains were seen to be formed regularly around the individual nuclei forming surfaces. The crystal grains had an almost same size of about 40 µm. The height of the crystal grains was about 15 µm.

The concentration of Sb mixed in the Si layer was evaluated as about $10^{20}$ cm$^{-3}$. Since Sb mixed in Si acts as a doner, a n type Si layer is formed.

EXAMPLE 4

Figure 8:
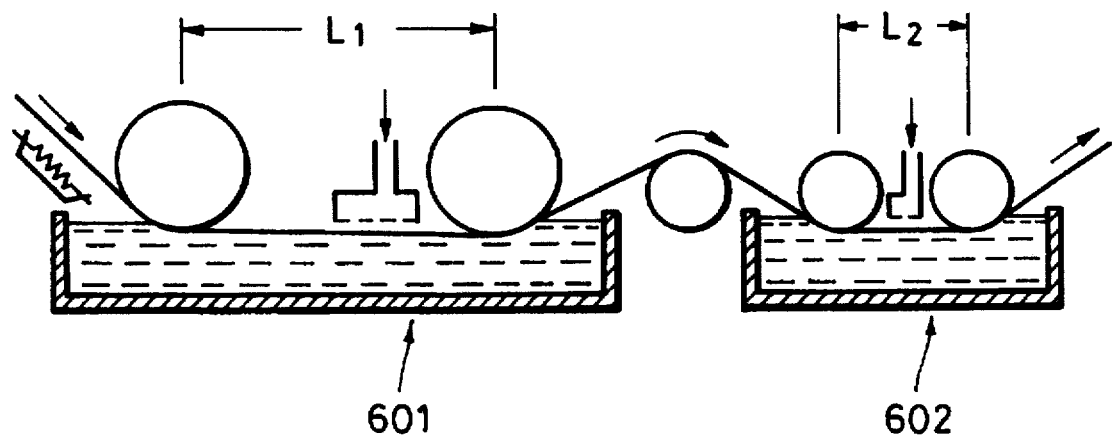
FIG. 8 is a schematic view of a device for forming a semiconductor body having a semiconductor junction according to the present invention.

Two devices 601 and 602 shown in FIG. 7 were disposed such that the stainless sheet sequentially passes therethrough, as shown in FIG. 8. The device 601 used a molten Si mixed with In, as in the case of Example 2. An interval $L_1$ between the rollers was 50 cm, and the flow rate of the cooling Ar gas was 500 sccm. In the device 602, a molten Si mixed with Sb was used, as in the case of Example 3. An interval $L_2$ between the rollers was 5 cm, and the flow rate of the cooling Ar gas was 50 sccm.

Under the above conditions, a stainless sheet having a width 50 mm and a thickness of 0.1 mm was fed at a speed of 5 cm/min. As shown in FIG. 9(a), a p type area 204 of Si crystal containing In as impurities was formed around each of holes 203 formed in a silicon oxide layer 202 on a stainless sheet 201 while the stainless sheet was fed in the device 601, and then a n type area 205 containing Sb as impurities was formed on the p type area 204 by the passage through the device 602. The crystal gains were not in contact with each other. The stainless sheet with the thus-obtained semiconductor layer formed thereon was cut into 5 cm pieces, and the cut pieces were set in a vacuum deposition device. After the vacuum deposition device was evacuated to $10^{-6}$ Torr, an alloy of In and Sn was supplied to the crucible to form a 700 Å thick ITO film on the n type silicon layer 205 by the resistance heating method as an upper electrode 206.

The thus-manufactured solar cell was evaluated using a solar simulator of AM 1.5. The open-circuit voltage was 0.55 v, the short-circuit current was 18 mA/cm$^2$, FF (curve factor) was 0.73, and the photoelectric conversion efficiency was 7.2%. These show that the manufactured solar cell had satisfactory characteristics.

A silicon layer was formed under the same conditions as those described above except that the interval $L_1$ between the rollers of the device 601 was 1 m. The crystal grains of the obtained layer were in contact with each other. Since the crystal grains were already in contact with each other by the time the stainless sheet was fed out of the device 601, it is estimated that the n type areas 205 were laid on top of the p type areas 204 which were in contact with each, as shown in FIG. 9(b). The upper electrode 206 was formed on the n type silicon layer 205 in the same manner as that described above to form a solar cell. When this solar cell was evaluated using the solar simulator, the open-circuit voltage was 0.55 v, the short-circuit current was 26 mA/cm$^2$, FF was 0.68, and the photoelectric conversion efficiency was 9.7%. This indicates that the manufactured solar cell had satisfactory characteristics.

The practical procedures of the method of forming a semiconductor layer according to the present invention have been described. From the above-described examples, it was made clear that excellent solar cells can be manufactured using the method of forming a semiconductor body according to the present invention. However, the present invention is not limited to the above-described examples.

That is, compounds, such as Ge, GaAs, GaP and InP, can be used in place of Si as the semiconductor in the present invention.

Also, a pn junction may be formed not by laying the layers of semiconductors having different conductivities on top of the other by the method according to the present invention, as in the case of Example 4, but by forming the semiconductor layer by the method according to the present invention and then by thermally diffusing impurities from the surface or the substrate side (silicon oxide side). The latter method is effective to form a back surface field (BSF). The back surface field may be formed by diffusing on the side of the substrate impurities having the same conductivity as that of the semiconductor layer at a high concentration.

Also, a highly efficient solar cell, in which a plurality of photovoltaic elements are laid on top of another, can be manufactured by forming on the solar cell formed by the method according to the present invention a semiconductor layer formed by the method according to the present invention or other methods.

Thus, application of the present invention is indeed wide. Various examples of such applications will be described below.

EXAMPLE 5

After the surface of a stainless sheet, having a width of 50 mm and a thickness of 1 mm, was thoroughly washed, a silicon oxide film was formed to a thickness of 500 Å by the continuous film forming device which employed the reactive sputtering process. Thereafter, holes were formed in the silicon oxide film using the method of exposing a photo resist by a laser beam, shown in FIG. 5, to form nuclei forming surfaces. The holes were patterned in the manner shown in FIG. 6(a). The diameter d of each hole was about 5 μm, and the interval 1 between the holes was 75 μm.

Figure 10:
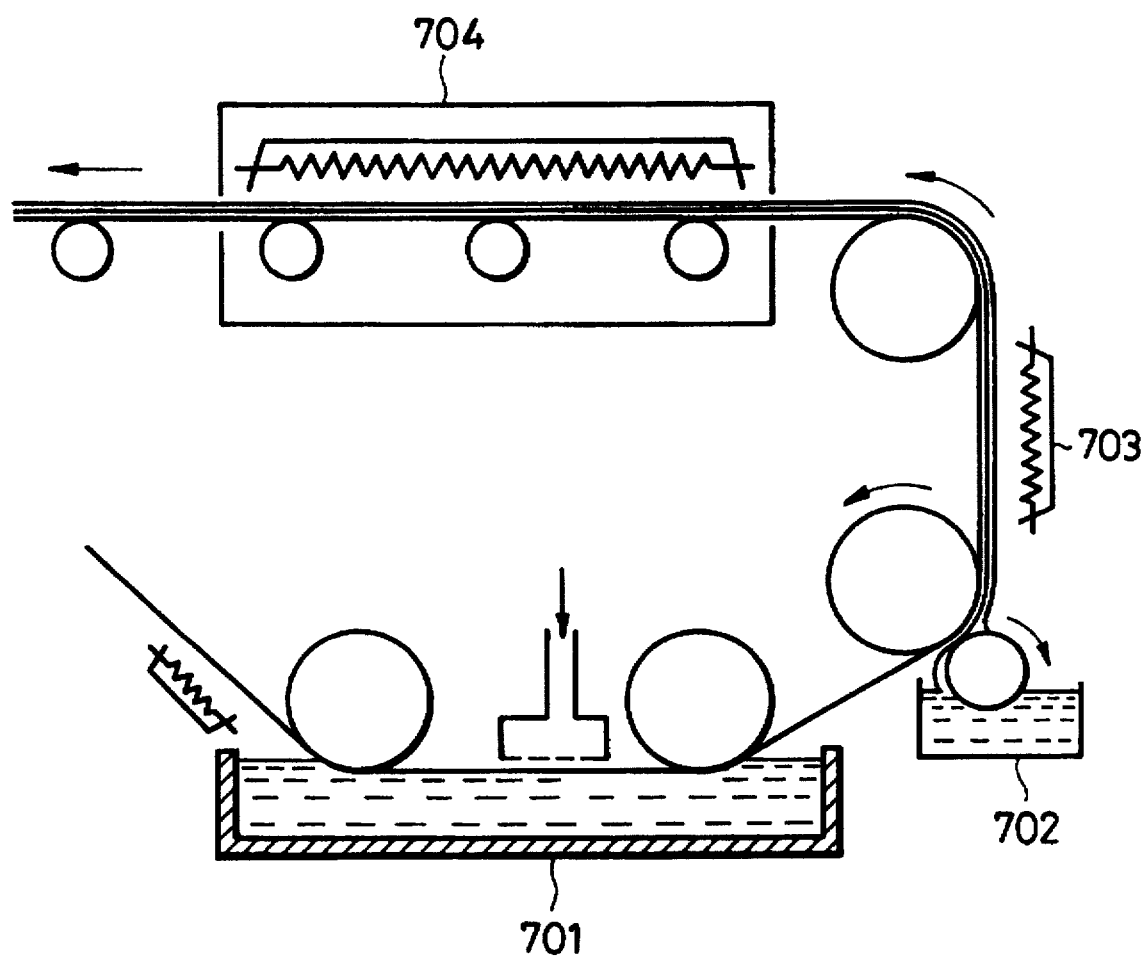
FIG. 10 is a schematic view of a device for forming a semiconductor body having a semiconductor junction according to the present invention.

Formation of the semiconductor layer and of the pn junction was conducted on the thus-obtained stainless sheet using a device shown in FIG. 10. More specifically, a Si layer containing In as impurities was formed on the stainless sheet under the same conditions as those of Example 2 using a semiconductor layer forming device 701 having the same structure as the device shown in FIG. 7. Thereafter, a saturated solution of phosphorus glass ($P_2O_5$) dissolved in acetone was coated on the Si layer by a coater 702, and then the sheet was heated to 120° C. by a drying heater 703 to evaporate acetone. Subsequently, the sheet was passed through an electric path 704 having a length of 3 m and was thereby heated to 1100° C. to thermally diffuse p into the Si layer.

The results of the SIMS analysis showed that p was diffused to a depth of about 0.5 μm in the Si layer having a thickness of about 50 μm.

Next, the upper electrode was formed on the Si layer in the same manner as Example 4.

The thus-manufactured solar cell was evaluated using a AM-1.5 solar simulator. The open-circuit voltage was 0.56 v, the short-circuit current was 24 mA/cm$^2$, FF (curve factor) was 0.70, and the photoelectric conversion efficiency was 9.4%. These indicate that the solar cell had satisfactory characteristics.

EXAMPLE 6

After the surface of a stainless sheet, having a width of 50 mm and a thickness of 0.1 mm, was thoroughly washed, a 1000 Å thick silicon film in which B was present at a concentration of $5.0 \times 10^{20}$ cm$^{-3}$ was formed by the thermal CVD process using $SiH_4$ and $B_2H_6$. The formed silicon film was oxidized for five minutes by an electric furnace whose temperature was maintained to 900° C. in a vapor atmosphere. The nucleus forming surfaces were formed in the obtained silicon oxide film by the same manner as Example 5, and then formation of the semiconductor layer and formation of the pn junction were conducted in the same manner as Example 5. Thereafter, the upper electrode was formed on the Si layer in the same manner as Example 4.

The manufactured solar cell was evaluated using a AM-1.5 solar simulator. The open-circuit voltage was 0.62 v, and the short-circuit was 26 mA/cm$^2$. FF was 0.72, and the photoelectric conversion efficiency was 11.6%. As compared with the solar cell of Example 5, the photoelectric conversion efficiency of the solar cell of Example 6 has improved. This is considered due to the back surface field (BSF) effect caused by thermally diffusing B atoms in the oxide silicon in the silicon film.

EXAMPLE 7

Formation of a silicon film and that of nucleus forming surfaces were conducted on the stainless sheet in the same manner as that of Example 5. However, the nuclei forming surfaces were patterned in the manner shown in FIG. 6(a). The diameter d was 3 μm, and the interval L was 15 μm.

In the device shown in FIG. 7, pellets of zinc (Zn) were supplied to the quartz crucible 502 and were then heated to melt them. Thereafter, the temperature of the molten zinc was increased to 715° C. In that state, the stainless sheet 504 having a width of 50 mm and a thickness of 0.1 mm was fed at a speed of 5 cm/min through the rollers 505 and 506 which were separated by an interval L of 50 cm. The surface of the stainless sheet 504 was heated by the preheating heater 507° to 720° C. The portion of the stainless sheet 504 located between the rollers 505 and 506 was brought into contact with the molten Zn 501. At that time, no cooling gas was supplied to the cooling means 508.

In that state, contact of the stainless sheet 504 with the molten Zn 501 formed nothing on the undersurface of the stainless sheet 504.

Next, gallium arsenide (GaAs) power was added to the molten Zn 501 little by little while the molten Zn was stirred. When a thin GaAs layer started growing on the undersurface of the stainless sheet 504, addition of GaAs power was suspended and the temperature of the molten Zn was increased to 720° C. Again, contact of the stainless sheet 504 with the molten Zn formed nothing on the surface of the sheet 504.

Subsequently, argon (Ar) was supplied to the cooling means 508 at a rate of 100 sccm as the cooling gas, by which a GaAs layer started growing again on the surface of the stainless sheet 504.

The surface of the obtained GaAs layer was observed using a scanning type electronic microscope. It was seen that polygonal crystal gains were formed regularly around the individual nuclei forming surfaces. The crystal grains had an almost same size of about 10 μm. The height of the crystal grains was evaluated as 3 to 4 μm by a surface roughness tester.

The concentration of Zn mixed in the GaAs layer was evaluated as about $5 \times 10^{16}$ cm$^{-3}$. Since Zn mixed in GaAs acts as an acceptor, a p type GaAs layer is formed.

EXAMPLE 8

In the device shown in FIG. 7, pellets of tin (Sn) were supplied to the quartz crucible 502 and were then heated to melt them. Thereafter, the temperature of the molten tin was increased to 835° C. In that state, the stainless sheet 504, having a width of 50 mm and a thickness of 0.1 mm and processed in the same manner as that of Example 7, was fed at a speed of 5 cm/min through the rollers 505 and 506 which were separated by an interval L of 50 cm. The surface of the stainless sheet 504 was heated by the preheating heater 507° to 840° C. The portion of the stainless sheet 504 located between the rollers 505 and 506 was brought into contact with the molten Sn 501. At that time, no cooling gas was supplied to the cooling means 508.

In that state, contact of the stainless sheet 504 with the molten Sn 501 formed nothing on the undersurface of the stainless sheet 504.

Next, gallium arsenide (GaAs) power was added to the molten Sn 501 little by little while the molten Sn was stirred. When a thin GaAs layer started growing on the undersurface of the stainless sheet 504, addition of GaAs power was suspended and the temperature of the molten Sn was increased to 840° C. Again, contact of the stainless sheet 504 with the molten Sn formed nothing on the surface of the sheet 504.

Subsequently, argon (Ar) was supplied to the cooling means 508 at a rate of 100 sccm as the cooling gas, by which a GaAs layer started growing again on the surface of the stainless sheet 504.

The surface of the obtained GaAs layer was observed. It was seen that polygonal crystal gains were formed regularly around the individual nuclei forming surfaces. The crystal grains had an almost same size of about 10 μm. The height of the crystal grains was evaluated as 3 to 4 μm by a surface roughness tester.

The concentration of Sn mixed in the GaAs layer was evaluated as about $5 \times 10^{17}$ cm$^{-3}$. Since Sn mixed in GaAs acts as a doner, a n type GaAs layer is formed.

EXAMPLE 9

Two devices 601 and 602 shown in FIG. 7 were disposed such that the stainless sheet sequentially passes therethrough, as shown in FIG. 8. The device 601 employed a molten GaAs dissolved in Zn, as in the case of Example 7. An interval $L_1$ between the rollers was 50 cm, and the flow rate of the cooling Ar gas was 100 sccm. In the device 602, a molten GaAs dissolved in Sn was used, as in the case of Example 8. An interval $L_2$ between the rollers was 5 cm, and the flow rate of the cooling Ar gas was 10 sccm.

Under the above conditions, a stainless sheet having a width 50 mm and a thickness of 0.1 mm was fed at a speed of 3 cm/min. A p type GaAs layer 204 containing Zn as impurities was formed on one surface of a stainless sheet 201 in the device 601, and then a n type GaAs layer 205 containing Sn as impurities was formed on the p type GaAs layer 204 by the passage through the device 602. The crystal gains were in contact with each other, as shown in FIG. 9(b).

The stainless sheet with the thus-obtained semiconductor layer formed thereon was cut into 5 cm pieces, and a 700 Å thick ITO film was then deposited in the same manner as that of Example 4 to form an upper electrode 206.

The thus-manufactured solar cell was evaluated using a solar simulator of AM 1.5. The open-circuit voltage was 0.68 v, and the short-circuit current was 30 mA/cm². FF was 0.67, and the photoelectric conversion efficiency was 13.7%. These show that the manufactured solar cell had satisfactory characteristics.

EXAMPLE 10

Figure 11:
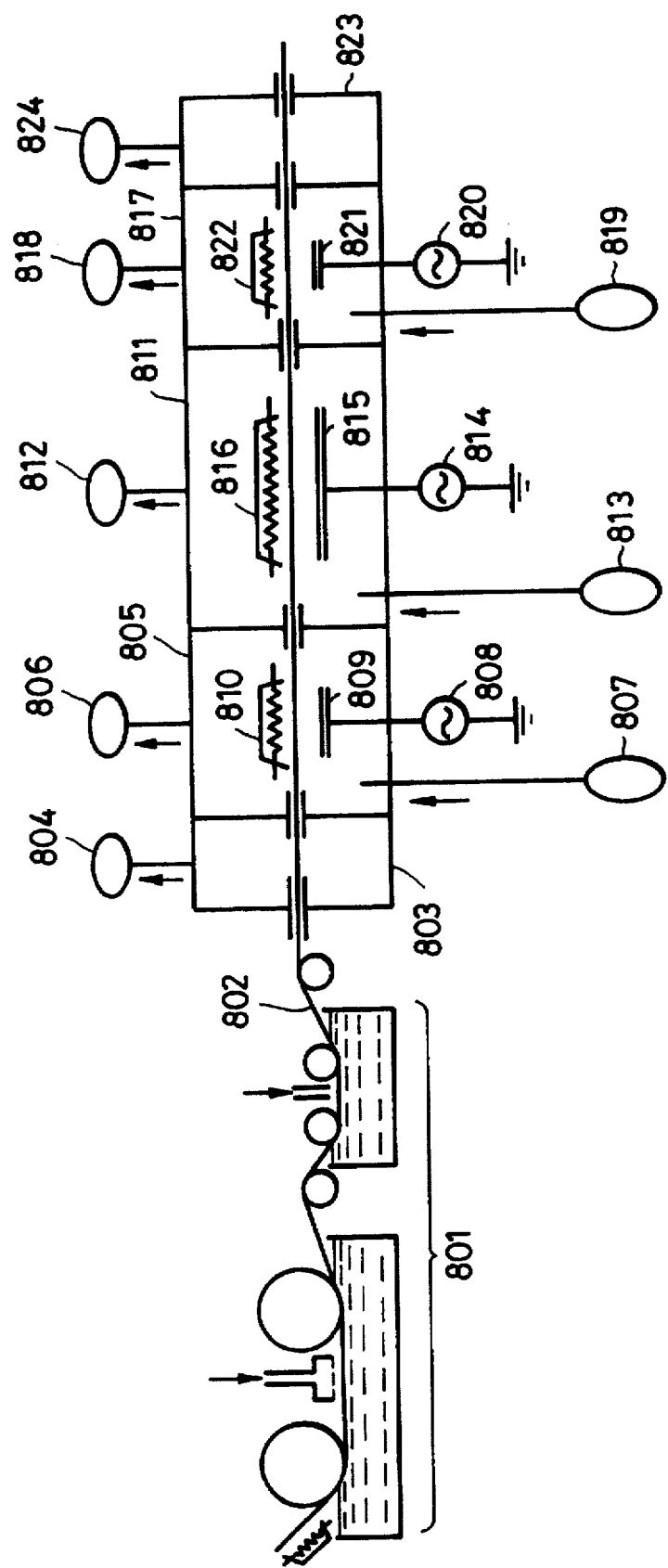
FIG. 11 is a schematic view of a device for forming a laminate type solar cell according to the present invention.

An example of manufacture of a laminated photovoltaic element shown in FIG. 12 will be described with reference to FIG. 11. This laminated photovoltaic element is manufactured by laying an amorphous silicon photovoltaic element on the crystal silicon photovoltaic element manufactured by a film forming device 801 which is the same as that shown in FIG. 8.

A semiconductor layer was formed on the stainless sheet processed in the same as that of Example 6. More specifically, a Si layer 904 containing In as impurities was formed on a stainless sheet 901 on which a silicon oxide layer 902 and nucleus forming surfaces 903 were formed in the same manner as that of Example 6, and then a Si layer 905 containing Sb as impurities was formed on the Si layer 904, as shown in FIG. 12. Thereafter, the sheet was passed through a preliminary evacuation chamber 803, film forming chambers 805, 811 and 817, and a preliminary evacuation chamber 823.

These preliminary chambers and film forming chambers are respectively evacuated by vacuum pumps 804, 806, 812, 828 and 824. The preliminary evacuation chambers 803 and 823 respectively prevent the atmosphere from entering the film forming chambers 805 and 817. Material gases are supplied from the material gas supply sources 807, 813 and 819 to the film forming chambers 805, 811 and 817, respectively. Heaters 810, 816 and 822 are respectively provided in the film forming chambers 805, 811 and 817 to heat the sheet. Also, cathodes 809, 815 and 821 are respectively provided in the film forming chambers 805, 811 and 817. A high-frequency voltage is applied to the cathodes 809, 815 and 821 from a high-frequency power sources 808, 814 and 820 of 13.56 MHz, respectively.

Monosilane (SiH$_4$), diborane (B$_2$H$_6$) and hydrogen gas (H2) were supplied to the first film forming chamber 805 at a flow rate 50 sccm and at a flow rate ratio of 1:0.5:5. The pressure in the film forming chamber was maintained to 0.2 Torr and the temperature of the sheet was kept at 300° C. In that state, a glow discharge was generated to form a p type amorphous silicon (a-Si) layer 906 on the layer 905, as shown in FIG. 12.

SiH$_4$ was supplied to the second film forming chamber 811 from the material gas supply source 813 at a flow rate of 50 sccm. The pressure in the film forming chamber was maintained to 0.2 Torr and the temperature of the sheet was kept at 250° C. In that state, a glow discharge was generated to form a i type a-Si layer 906 on the layer 906, as shown in FIG. 12.

SiH$_4$, phosphine gas (PH$_3$) and H$_2$ were supplied to the third film forming chamber 817 from the material gas supply source at a flow rate of 50 sccm and at a flow rate ratio of 1:0.5:10. The pressure in the chamber was maintained to 0.2 Torr and the temperature of the sheet was kept at 200° C. In that state, a glow discharge was generated to form a n type a-Si layer 908 on the layer 907, as shown in FIG. 12.

After the sheet-like support member with the semiconductor layers formed thereof was fed from the preliminary evacuation chamber 823, it was cut into 5 cm long pieces. The cut pieces were set in a vacuum deposition device, and reactive deposition was conducted at $3 \times 10^{-4}$ Torr using alloy pellets of In: Sn=1:1 as evaporation sources while oxygen was supplied to form a 700 Å thick ITO (In$_2$O$_3$+ SnO$_2$) transparent electrode 909 on the layer 908, as shown in FIG. 12.

Figure 12:
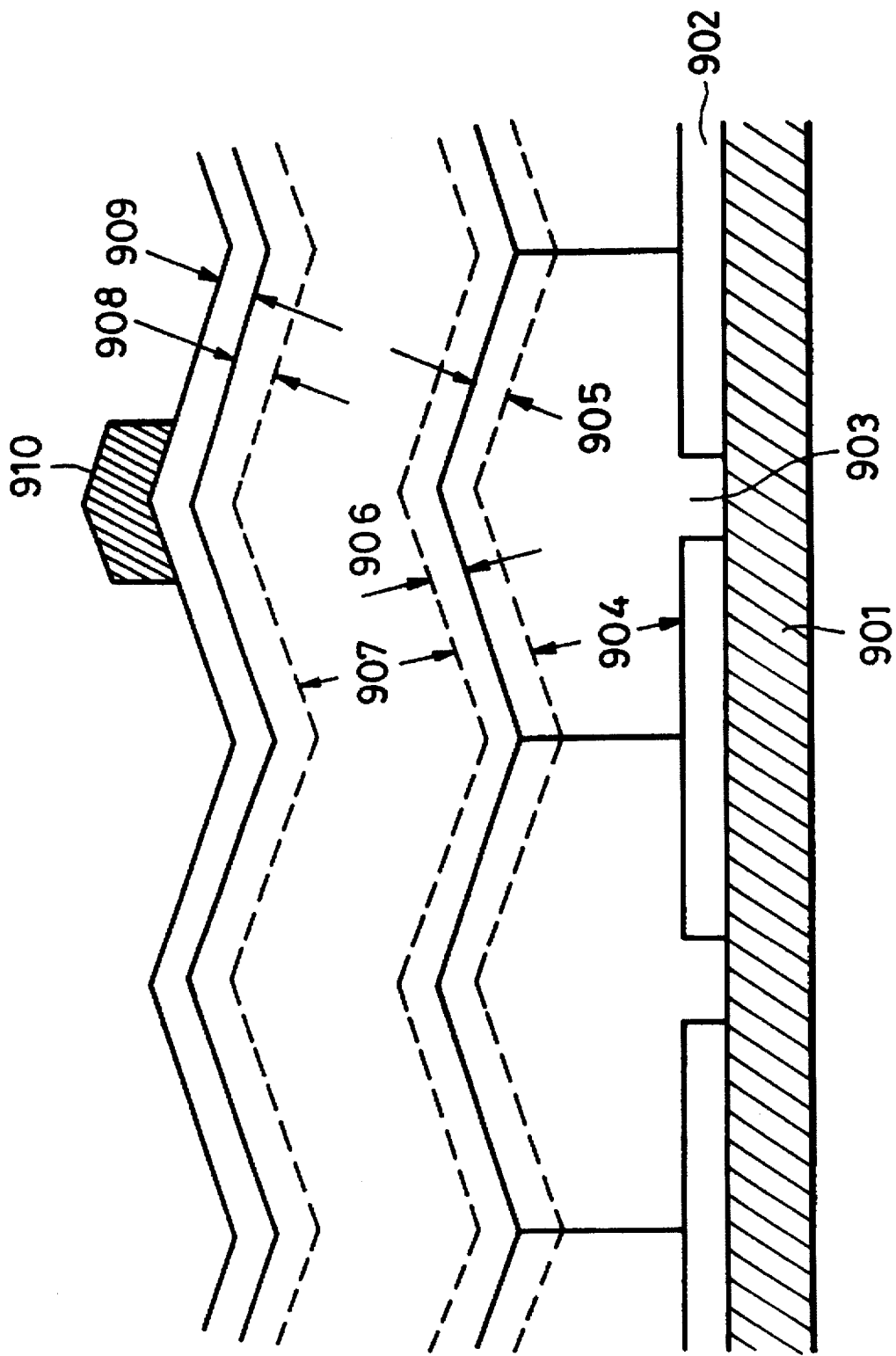
FIG. 12 is a schematic cross-sectional view of the laminate type solar cell according to the present invention.

Thereafter, a grid electrode 910 was formed on the transparent electrode 909, as shown in FIG. 12.

It was made clear from the SIMS analysis that the p type a-Si layer 906, the i type a-Si layer 906 and the n type s-Si layer 908 were respectively 200 Å, 3000 Å and 100 Å.

The thus-obtained solar cell was evaluated using the AM-1.5 solar simulator. The open-circuit voltage was 1.50 v, and the short-circuit current was 13 mA/cm². FF (curve factor) was 0.70, and the photoelectric conversion efficiency was 13.7%. These indicate that the obtained solar cell had satisfactory characteristics.

EXAMPLE 11

Figure 13:
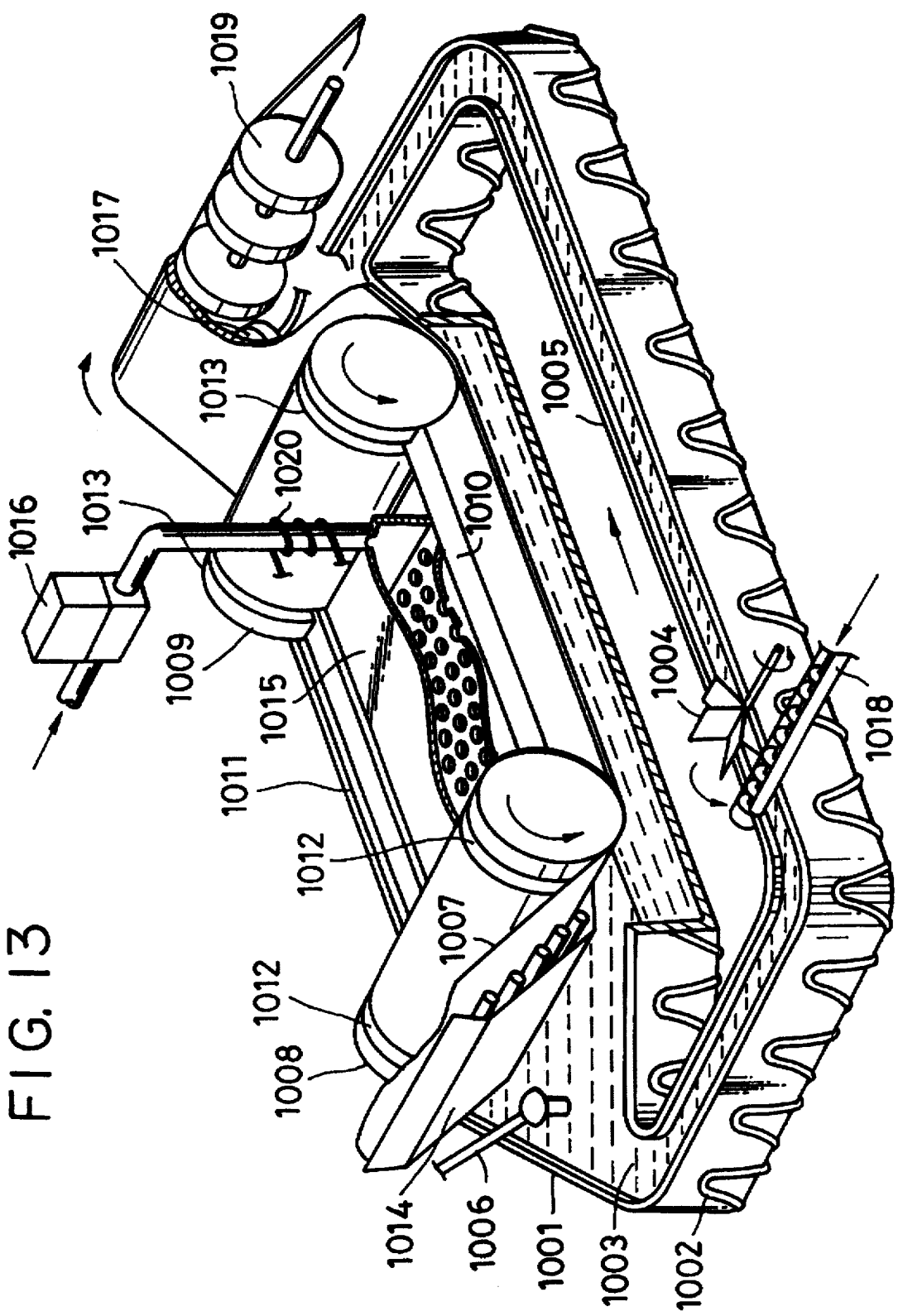
FIG. 13 is a schematic view of a device suitable for carrying out the semiconductor film forming method according to the present invention.

FIG. 13 is a schematic view of a device used to carry out the present invention.

In FIG. 13, a melting tank 1001 having a quartz glass coating on the inner surface thereof is heated by a heater 1002 from the outer side thereof. The melting tank 1001 contains a melting solution 1003 in which Si is dissolved in In at almost saturation concentration. The melting solution 1003 is circulated through a flow passage 1005 by an impeller 1004 and thereby slowly flows in the melting tank 1001. The temperature of the melting solution 1003 is measured by a thermocouple 1006 so that it can be maintained to 840° C.

A stainless sheet 1007 whose surface is Ni plated and which has a width of 30 cm and a thickness of 0.1 mm is extending between rollers 1008 and 1009 separated from each other by 5 m. The undersurface of the stainless sheet 1007 is in contact with the melting solution 1003. A pair of bars 1010 and 1011 are disposed on the two sides of the sheet between the two rollers to prevent the melting solution from reaching the upper surface of the sheet 1007. The bars each have a quartz glass coating on the surface thereon. The two ends of each of the bars 1010 and 1011 are inserted in circumferential grooves 1012 and 1013 respectively provided on the outer peripheral surfaces of the rollers 1008 and 1009. The stainless sheet 1007 is moving from the side of the roller 1008 toward the side of the roller 1009 at a speed of 1 m/min. The sheet 1007 is preheated to 840° C. by a preheater 1014 before it makes contact with the melting solution 1003.

The portion of the stainless sheet 1007 which is in contact with the melting solution 1003 is cooled from above by cooling means 1015. The cooling means 1015 blows to the sheet nitrogen gas supplied at a flow rate of 2 SLM. The flow rate of the gas is adjusted by a flow rate adjuster 1016. The cooling means has a large number of holes at the lower portion thereof. The holes are provided such that the density thereof gradually increases in the direction of travel of the stainless sheet. Hence, the temperature of the sheet 1007 gradually decreases as the sheet proceeds. A heater 1020 is provided to heat the nitrogen gas. The temperature of the nitrogen gas can be adjusted by controlling generation of heat from the heater.

The thickness of a Si layer deposited on the stainless sheet 1007 is monitored by a thickness measuring monitor 1017 located just beyond the roller 1009. The concentration of Si in the melting solution 1003 decreases with time, thereby decreasing the thickness of the formed Si layer. Hence, Si power is supplemented by a stoker 1018.

The stainless steel with the Si layer containing In formed on one surface thereof is turned by a direction-turning roller 1019, and then a Si layer containing Sb is formed on the Si layer containing In by a device similar to the device shown in FIG. 13. At that time, the interval between the two rollers was set to 50 cm, and the nitrogen gas was supplied from the cooling means at a flow rate of 200 sccm. The temperature of the melting solution was maintained to 720° C.

The manufactured sheet-like member with the Si semiconductor layers formed thereon was cut into 20 cm long pieces. Al was deposited on the surface of each piece by the mask deposition to form a grid electrode. The obtained solar cell plates were arranged to obtain a solar cell array shown in FIG. 14.

FIG. 14(a) is a plan view of the solar cell array, and FIG. 14(b) is a section taken along the line B—B of FIG. 14(a). In the structure shown in FIG. 14, series-connected solar cell plates 1102 each having dimensions of 30 cm×20 cm were pasted on an alumina plate 1101 using an epoxy resin. The end portion of a grid electrode 1103 of each solar cell plate was adhered using a conductive paste whose main component was copper to and thereby electrically connected to the rear side of the adjoining solar cell plate (the side of the solar cell plate on which the stainless sheet was exposed). Also, terminals 1104 and 1105 were respectively connected to the grid electrode of one of the two solar cell plates disposed at the end and the exposed portion of the stainless sheet of the other solar cell plate.

The thus-obtained solar cell array was set such that the sunlight entered the array perpendicular thereto on a fine day at the time of culmination, and the output of the array was measured. The open-circuit voltage was 2.95 v, and the short-circuit current was 13.6 a. FF (curve factor) was 0.67, and the output was 26.9 w. These indicate that the obtained solar cell array had excellent characteristics.

The solar cell plates required to manufacture the module of this example could be manufactured for about one minutes. Consequently, production cost of the solar cells can greatly be reduced.

As will be understood from the foregoing description, in the present invention, since the semiconductor layer whose crystal grain size can be sufficiently controlled can be formed on the support member, as compared with the conventional method of forming a single crystal or polycrystal semiconductor substrate or layer, excellent reproducibility of the characteristics can be obtained, and waste of the material can be avoided. Furthermore, since the temperature for the growth of a semiconductor can be made low, a flexible metal sheet can be used as the support member, facilitating continuous formation. Furthermore, a solar cell can be manufactured using the metal sheet as one of the electrodes. Consequently, solar cells having a high conversion efficiency can be manufactured highly effectively at low production cost.

What is claimed is:

1. A method of manufacturing a solar cell, comprising the steps of:

preparing a substrate in sheet form having an insulating film and holes which pass through said insulating film, said holes being dispersed at a uniform density;

preparing a solution in which a semiconductor material is dissolved;

conveying said substrate along a surface of the solution so as to grow a single crystal nucleus from each of said holes and thereby form a set of single crystal semiconductors on said substrate;

and wherein a silicon oxide film contains impurity elements which can control conductivity type of the semiconductor material, the impurity elements in the silicon oxide film being diffused into said single crystal semiconductors when said single crystal semiconductors are formed on the surface of the silicon oxide film and, forming an electrode on said single crystal semiconductors.

2. The method of manufacturing a solar cell according to claim 1, wherein the semiconductor material comprises at least one semiconductor material selected from the group consisting of Si, Ge, Ga, As, In and P.

3. The method of manufacturing a solar cell according to claim 1, wherein the solvent comprises at least one substance selected from the group consisting of In, Sb, Zn, Sn, Ga and B.

4. The method of manufacturing a solar cell according to claim 1 wherein said substrate in sheet form is made of at least one material selected from the group consisting of stainless steel, aluminum, copper and nickel.

5. The method of manufacturing a solar cell according to claim 1, wherein the silicon oxide film is at least 500 Å in thickness.

6. The method of manufacturing a solar cell according to claim 1, wherein said holes formed in said insulating film are formed by photolithography.

7. The method of manufacturing a solar cell according to claim 1, wherein the diameter of said holes is no greater than 20 μm.

8. The method of manufacturing a solar cell according to claim 1, wherein the interval of said holes is from 30 μm to 500 μm.

9. The method of manufacturing a solar cell according to claim 1, including the step of heating said substrate to a temperature higher than the temperature of said solution before said substrate is brought into contact with said solution.

10. The method of manufacturing a solar cell according to claim 1, including the step of cooling said substrate to a temperature lower than the temperature of said solution during the time said substrate is in contact with said solution.

11. The method of manufacturing a solar cell according to claim 1, wherein a length of said substrate contacting said solution from 1.5 cm to 20 m.

12. The method of manufacturing a solar cell according to claim 1, wherein a speed to convey said substrate is from 0.5 cm/min and 5 m/min.

13. The method of manufacturing a solar cell according to claim 10, wherein said cooling step is conducted by a cooling gas at a temperature (i) from 5° to 50° C. and (ii) lower than the temperature of said solution.

* * * * *

UNITED STATES PATENT AND TRADEMARK OFFICE
CERTIFICATE OF CORRECTION

PATENT NO. : 5,712,199
DATED : January 27, 1998
INVENTOR(S) : KATSUMI NAKAGAWA, ET AL.

It is certified that error appears in the above-identified patent and that said Letters Patent is hereby corrected as shown below:

On the title page, item [56]

U.S. PATENT DOCUMENTS

"5,007,034 4/1991 Satoh et al." should read
--5,070,034 12/1991 Satoh et al.--.

OTHER PUBLICATIONS

After Freyhardt, "1980." should read
--1980, pp. 21-45.--.

COLUMN 1

Line 50, "silicon" should read
--single-crystal silicon--; and
Line 51, "substrate" should read
--single-crystal substrate--.

COLUMN 2

Line 45, "Res.," should read --Res.--.

COLUMN 4

Line 12, "a schematic view" should read
--schematic views--;
Line 33, "a schematic cross-sectional view" should read
--schematic cross-sectional views--; and
Line 47, "a schematic view" should read
--schematic views--.

UNITED STATES PATENT AND TRADEMARK OFFICE
CERTIFICATE OF CORRECTION

PATENT NO. : 5,712,199
DATED : January 27, 1998
INVENTOR(S) : KATSUMI NAKAGAWA, ET AL.

It is certified that error appears in the above-identified patent and that said Letters Patent is hereby corrected as shown below:

COLUMN 5

Line 25, "stepsof" should read --steps of--.

COLUMN 6

Line 3, "is" should read --are--.

COLUMN 7

Line 36, "complicating" should read --complicated--.

COLUMN 8

Line 15, "507°" should read --507--;
Line 23, "power" should read --powder--;
Line 27, "power" should read --powder--;
Line 36, "gains" should read --grains--; and
Line 60, "gains" should read --grains--.

COLUMN 9

Line 9, "507°" should read --507--;
Line 17, "power" should read --powder--;
Line 21, "power" should read --powder--;
Line 30, "gains" should read --grains--;
Line 47, "507°" should read --507--;
Line 54, "power" should read --powder--;
Line 57, "power" should read --powder--; and
Line 61, "means 508 at a rate" should read
--was supplied to the--.

UNITED STATES PATENT AND TRADEMARK OFFICE
CERTIFICATE OF CORRECTION

PATENT NO. : 5,712,199
DATED : January 27, 1998
INVENTOR(S) : KATSUMI NAKAGAWA, ET AL.

It is certified that error appears in the above-identified patent and that said Letters Patent is hereby corrected as shown below:

COLUMN 10

Line 6, "doner, a" should read --donor, an--;
Line 19, "width" should read --width of--; and
Line 26, "gains" should read --grains--.

COLUMN 11

Line 46, "p" should read --P--; and
Line 48, "p" should read --P--.

COLUMN 12

Line 16, "oxide silicon" should read --silicon oxide--;
Line 32, "507°" should read --507--;
Line 40, "power" should read --powder--;
Line 43, "power" should read --powder--; and
Line 54, "gains" should read --grains--.

COLUMN 13

Line 13, "power" should read --powder--;
Line 16, "power" should read --powder--;
Line 27, "gains" should read --grains--;
Line 34, "doner, a" should read --donor, an--; and
Line 53, "gains" should read --grains--.

COLUMN 14

Line 7, "same" should read --same manner--;
Line 29, "a" should be deleted;
Line 32, "H2" should read --$H_2$--;

UNITED STATES PATENT AND TRADEMARK OFFICE
CERTIFICATE OF CORRECTION

PATENT NO. : 5,712,199
DATED : January 27, 1998
INVENTOR(S) : KATSUMI NAKAGAWA, ET AL.

It is certified that error appears in the above-identified patent and that said Letters Patent is hereby corrected as shown below:

Line 33, "rate" should read --rate of--; (First occurrence)
Line 44, "906" (second occurrence) should read --905--; and
Line 54, "thereof" should read --thereon--.

COLUMN 15

Line 56, "power" should read --powder--.

COLUMN 16

Line 1, "A1" should read --Al-- and "the" (second occurrence) should be deleted;
Line 20, "at the time of culmination," should be deleted;
Line 22, "13.6a" should read --13.6mA/cm$^2$--;
Line 23, "26.9 w" should read --26.9 W--; and
Line 26 and 27, "for about one minutes" should read --in about one minute--.

COLUMN 18

Line 12, "solution" should read --solution is--.

Signed and Sealed this

Fifteenth Day of September, 1998

Attest:

BRUCE LEHMAN

Attesting Officer    Commissioner of Patents and Trademarks